US010468317B2

(12) United States Patent
Schwarz et al.

(10) Patent No.: US 10,468,317 B2
(45) Date of Patent: Nov. 5, 2019

(54) ELECTRONIC COMPONENT AND METHOD FOR PRODUCING AN ELECTRONIC COMPONENT

(71) Applicant: OSRAM Opto Semiconductors GmbH, Regensburg (DE)

(72) Inventors: Thomas Schwarz, Regensburg (DE); Stefan Groetsch, Bad Abbach (DE); Joerg Erich Sorg, Regensburg (DE); Christoph Koller, Nittendorf (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 16/047,873

(22) Filed: Jul. 27, 2018

(65) Prior Publication Data
US 2019/0035702 A1 Jan. 31, 2019

(30) Foreign Application Priority Data
Jul. 28, 2017 (DE) .......................... 10 2017 117 165

(51) Int. Cl.
*H01L 23/14* (2006.01)
*H01L 29/866* (2006.01)
(Continued)

(52) U.S. Cl.
CPC ............ *H01L 23/142* (2013.01); *H01L 23/60* (2013.01); *H01L 29/866* (2013.01);
(Continued)

(58) Field of Classification Search
CPC . H01L 23/142; H01L 23/60; H01L 31/02002; H01L 31/024; H01L 33/486;
(Continued)

(56) References Cited

U.S. PATENT DOCUMENTS

2004/0222433 A1* 11/2004 Mazzochette ....... H01L 25/0753
257/99
2008/0169480 A1* 7/2008 Weng .................... H01L 33/486
257/98
(Continued)

FOREIGN PATENT DOCUMENTS

DE 102014116529 A1 5/2016
DE 102015108420 A1 12/2016

*Primary Examiner* — Victor A Mandala
(74) *Attorney, Agent, or Firm* — McDermott Will & Emery LLP

(57) ABSTRACT

Electronic component with a support comprising a first inorganic insulating layer and a second inorganic insulating layer, between which a metal core is arranged, a first, a second and a third electrically conductive structure which are arranged on a top surface of the carrier, a first and a second electrical contact point and a thermal contact point, which are arranged on a bottom surface of the carrier, a component and an electrical protection element which are arranged on the side of the top surface of the carrier, in which the first electrically conductive structure is electrically conductively connected to the first electrical contact point, the second electrically conductive structure is electrically conductively connected to the second electrical contact point, the third electrically conductive structure is electrically conductively connected to the thermal contact point, the component is electrically conductively connected to the first and second electrically conductive structures, the electrical protection element is electrically conductively connected to the third electrically conductive structure and the first or second electrically conductive structure.

11 Claims, 6 Drawing Sheets

(51) Int. Cl.
*H01L 31/02* (2006.01)
*H01L 31/024* (2014.01)
*H01L 33/48* (2010.01)
*H01L 33/62* (2010.01)
*H01L 33/64* (2010.01)
*H05K 1/02* (2006.01)
*H05K 1/05* (2006.01)
*H01L 23/60* (2006.01)
*H01L 23/00* (2006.01)
*H01L 25/16* (2006.01)

(52) U.S. Cl.
CPC ...... *H01L 31/02002* (2013.01); *H01L 31/024* (2013.01); *H01L 33/486* (2013.01); *H01L 33/62* (2013.01); *H01L 33/641* (2013.01); *H05K 1/021* (2013.01); *H05K 1/053* (2013.01); *H01L 24/48* (2013.01); *H01L 24/49* (2013.01); *H01L 25/167* (2013.01); *H01L 2224/48091* (2013.01); *H01L 2224/48137* (2013.01); *H01L 2224/48227* (2013.01); *H01L 2224/48235* (2013.01); *H01L 2224/49052* (2013.01); *H01L 2224/49175* (2013.01); *H01L 2224/73265* (2013.01); *H01L 2924/12035* (2013.01); *H01L 2924/15313* (2013.01); *H01L 2933/0075* (2013.01)

(58) Field of Classification Search
CPC ..... H01L 33/62; H01L 33/641; H01L 29/866; H01L 2924/15313; H01L 2924/12035; H01L 2224/49175; H01L 2224/49052; H01L 2224/48235; H01L 24/48; H01L 2933/0075; H01L 2224/48091; H01L 2224/48227; H01L 2224/73265; H01L 24/49; H01L 25/167; H01L 2224/48137; H01L 2924/00014
See application file for complete search history.

(56) References Cited

U.S. PATENT DOCUMENTS

| | | | |
|---|---|---|---|
| 2012/0161190 A1* | 6/2012 | Yao | H01L 23/3677 257/99 |
| 2012/0229990 A1 | 9/2012 | Adachi et al. | |
| 2013/0009190 A1* | 1/2013 | Memida | H01L 33/486 257/98 |
| 2014/0167095 A1* | 6/2014 | Kim | H01L 24/48 257/99 |
| 2014/0239321 A1* | 8/2014 | Lu | H01L 25/167 257/89 |
| 2014/0293554 A1 | 10/2014 | Shashkov et al. | |
| 2014/0374801 A1* | 12/2014 | Ikeda | H01L 23/492 257/195 |
| 2015/0349223 A1* | 12/2015 | Lee | H01L 33/62 257/99 |
| 2016/0005722 A1* | 1/2016 | Illek | H01L 25/167 257/99 |
| 2017/0331019 A1* | 11/2017 | Schwarz | H01L 33/647 |

* cited by examiner

ELECTRONIC COMPONENT AND METHOD FOR PRODUCING AN ELECTRONIC COMPONENT

This patent application claims the priority of German patent application 102017117165.7, the disclosure content of which is hereby incorporated by reference.

One object to be solved is, inter alia, to provide an electronic component which has improved ESD stability and/or improved thermal properties. Another object to be solved is to provide a method for producing such an electronic component.

The electronic component is, for example, an optoelectronic component, in particular an optoelectronic semiconductor chip. For example, the electronic component is designed for the emission and/or detection of electromagnetic radiation. In particular, the electronic component in this case is a laser diode, a photodiode or a light-emitting diode.

In accordance with at least one embodiment, the electronic component comprises a carrier having a first inorganic insulating layer and a second inorganic insulating layer, between which a metal core is arranged. The first inorganic insulating layer and the second inorganic insulating layer are formed with, for example, an electrically insulating material. The first inorganic insulating layer and the second inorganic insulating layer may be formed with, for example, a ceramic material. In particular, the first and second inorganic insulating layers are formed with a same material. For example, the first and second inorganic insulating layers may be formed with aluminum oxide $Al_2O_3$. For example, the first and second inorganic insulating layers in the vertical direction, perpendicular to their main extension direction, have a thickness of between 5 µm and 80 µm inclusive, in particular between 20 microns and 40 microns inclusive.

Preferably, the first and the second inorganic insulating layer are each firmly bonded to the metal core mechanically firmly. For example, the metal core is formed with a metallic material, in particular copper. The first and second inorganic insulating layers may be formed, for example, by anodic oxidation of another metallic material electrodeposited on the metal core. In particular, the metallic material and the further metallic material may be formed with different metals. For example, the metallic material may be formed with copper and the further metallic material formed with aluminum. Alternatively, for example, the first and second inorganic insulating layers may not be additively deposited on the metal core but may be made by conversion, particularly oxidation, of the material of the metal core. The metal core may be formed, for example, with aluminum. In particular, the metal core may be made of aluminum. The first and second inorganic insulating layers may be formed with, for example, aluminum oxide. For example, the metal core in the vertical direction has a thickness of between 30 µm inclusive and 600 µm inclusive, especially between 100 µm and 400 µm inclusive.

In accordance with at least one embodiment, the electronic component comprises a first, a second and a third electrically conductive structure, which are arranged on a top surface of the carrier. The top surface of the carrier is, for example, the main surface of the carrier at the top side. In particular, the top surface of the carrier is formed with the first inorganic insulating layer. The electrically conductive structures are formed, for example, with a metal, in particular copper. The electrically conductive structures can be produced for example by means of electroplating or by vapor deposition. In particular, the electrically conductive structures are produced in a common method step. For example, the first, second and third electrically conductive structures are not in direct contact with each other. In particular, the electrically conductive structures are connected cohesively to the first inorganic insulating layer. The electrical conductive structures may have the same thickness in the vertical direction.

In accordance with at least one embodiment, the electronic component comprises a first and a second electrical contact point and a thermal contact point, which are arranged on a bottom surface of the carrier. The bottom surface of the carrier is, for example, a main surface of the carrier opposite the top surface on its underside. In particular, the top surface of the carrier is formed with the second inorganic insulating layer. The first, second and thermal contact point is formed, for example, with a metal, in particular copper. The contact points can be produced for example by means of electroplating or by vapor deposition. In particular, the contact points are produced in a common method step.

For example, the contact points are not in direct contact with each other. In particular, the contact points are connected cohesively to the second inorganic insulating layer. In particular, the electrical contact points and the thermal contact points are formed with a same material. For example, the electrical contact points and the thermal contact point are formed with the same material as the electrically conductive structures. The contact points may have the same thickness in the vertical direction.

The first and second electrical contact point are configured, for example, to be electrically conductively contacted by soldering, so that a predetermined current can be impressed via the first and second contact point, or a predetermined electrical voltage can be applied to the contact points. The thermal pad may be configured to transfer heat. In particular, the thermal contact point is adapted to be in direct mechanical contact with a heat sink and to dissipate the heat which arises during operation of the electronic component to the heat sink. For example, all contact points each have an outwardly exposed surface.

In particular, the electronic component may have more than two, for example exactly three or more, electrical contact points. For example, during intended operation of the electronic component, at least two of the electrical contact points are at a different electrical potential. A third and further electrical contact points can be set up, for example, in such a way that a signal can be transmitted via them during intended operation. By means of the signal, for example, data can be transmitted and/or the component can be controlled by means of the signal.

In accordance with at least one embodiment, the electronic component comprises a component and an electrical protection element, which are arranged on the side of the top surface of the carrier. For example, the component and the electrical protective element can be arranged on a side of an electrically conductive structure facing away from the carrier. In particular, the device and the electrical protection element may be in direct mechanical contact with an electrically conductive structure. For example, the component and the electrical protection element are arranged on different electrically conductive structures. Alternatively, the component and/or the electrical protection element may be arranged on a common electrically conductive structure. The component and/or the electrical protection element can also be arranged laterally next to electrically conductive structures, and be directly mechanically fixedly connected to the first inorganic insulating layer.

The component is, for example, a semiconductor component. For example, the device is manufactured by means of an epitaxial process. In particular, the component comprises an active region, which is set up to emit and/or detect electromagnetic radiation.

The electrical protection element is, for example, a diode which may be formed with a semiconductor material. In particular, the electrical protection element may comprise a multiplicity of diodes, in particular Zener diodes, which are, for example, connected in series, antiseries, parallel or antiparallel with one another. Alternatively, the protective element may be a varistor formed, for example, with a ceramic material. The electrical protection element is configured, for example, to limit electrical voltage to a maximum. For example, the electrical protection element has a low electrical conductivity below a predetermined applied voltage and an increased electrical conductivity above the predetermined voltage.

According to at least one embodiment, the first electrically conductive structure is electrically conductively connected to the first electrical contact point. For example, a first via is arranged in the carrier, which extends completely from the top surface to the bottom surface of the carrier through the carrier. In particular, the first via is electrically isolated from the metal core. The first via is formed, for example, with copper. In particular, the first via is formed with the same material as the first electrically conductive structure and/or the first electrical contact point. For example, in the region of the first via, the carrier has a third inorganic insulating layer, which is arranged between the metal core and the first via.

For example, the third inorganic insulating layer is formed with a same material as the first and second inorganic insulating layers. In particular, the third inorganic insulating layer and the first and second inorganic insulating layers may be manufactured in a common manufacturing process.

In accordance with at least one embodiment, the second electrically conductive structure is connected in an electrically conductive manner to the second electrical contact point. For example, a second via is arranged in the carrier, which extends completely from the top surface to the bottom surface of the carrier through the carrier. In particular, the second via is electrically isolated from the metal core. The second via is formed, for example, with copper. In particular, the second via is formed with the same material as the second electrically conductive structure and/or the second electrical contact. For example, in the region of the second via, the carrier has a third inorganic insulating layer, which is arranged between the metal core and the second via.

In accordance with at least one embodiment, the third electrically conductive structure is electrically conductively connected to the thermal contact point. For example, a third via is arranged in the carrier, which extends completely from the top surface to the bottom surface of the carrier through the carrier. In particular, the third via is electrically isolated from the metal core. The third via is formed, for example, with copper. In particular, the third via is formed with the same material as the third electrically conductive structure and/or the thermal contact point.

Alternatively, the third electrically conductive structure may be electrically conductively connected to the thermal contact point by means of the metal core. For example, the first inorganic insulating layer is removed in a first region and the second inorganic insulating layer is removed in a second region. The third electrically conductive structure may be in direct contact with the metal core in the first region and the thermal contact point may be in direct contact with the metal core in the second region.

According to at least one embodiment, the electrical protection element is electrically conductively connected to the third conductive structure and the first or second electrically conductive structure. In particular, the protective element has at least one first and one second contact, to which the protective element can be electrically connected. By way of example, the electrical protective element is arranged on the first, the second or the third electrically conductive structure and is electrically conductively connected to a first contact point. By means of a bonding wire, the electrical protection element may be connected to the second contact point, for example with an electrically conductive structure on which the electrical protection element is not arranged.

In particular, a predetermined electrical voltage is applied during intended operation between the first and the second electrically conductive structure, by means of which the component is driven and operated. Alternatively, a predetermined current can be impressed via the first and second electrical contact point, by means of which the component can be operated.

Among other things, an electronic component described here is based on the following considerations: electronic components can have a carrier for mechanical attachment and electrical contacting, which has contact points and electrically conductive structures on a bottom surface and a top surface opposite the bottom surface. In particular, a thermal contact point can be arranged on the bottom surface of the carrier. In particular, the thermal contact point with any other electrically conductive structure or electrically conductive contact points is electrically connected, so that no electrically insulating layers must be arranged downstream in the heat flow of the thermal contact point. However, during operation of the electronic component between the thermal contact point on the bottom surface of the carrier and electrically conductive structures on the top surface of the carrier, an electrical potential may arise which may be greater than a breakdown voltage of the carrier. This leads to a flashover, which can result in damage to the electronic component.

Among other things, the electronic component described here makes use of the idea of electrically connecting the thermal contact point with an electrical protective element, so that the maximum electrical voltage between the thermal contact point and electrically conductive structures does not exceed the breakdown voltage of the carrier. In particular, the thermal contact point is not intended to be impressed by a current into an electronic component to operate the electronic component, which, for example, is arranged on the top side of the device.

Advantageously, the carrier of an electronic component is thus protected against high voltages between the thermal contact point and electrically conductive structures, so that the breakdown voltage of the carrier is not exceeded. Nevertheless, the thermal contact point can be considered as floating in intended operation, so that the thermal contact point in the direction of heat flow no electrically insulating layer must be arranged downstream of the heat flow. Advantageously, this enables an improved reliability of the electronic component, in which heat generated during intended operation can be dissipated particularly well.

In accordance with at least one embodiment, the component cannot be operated via the thermal contact point. For example, between the component and the thermal contact point, the protective element interposed, which allows only at voltages in the order of magnitude of the breakdown voltages of the carrier and larger electrically conductive connection between the component and the thermal contact point. In particular, the voltage at which a current of at least 0.5 mA, in particular at least 10 mA, flows through the protective element is at least ten times the operating voltage of the component.

For example, the protective element is nominally non-conductive in the region of voltages with which the component can be operated, so that the protective element prevents, in particular at least impedes, the impressing of a current through the thermal contact point. Advantageously, the electrical voltage between the thermal contact point and an electrically conductive structure in intended operation is within a predetermined range of voltage values. This ensures that the breakdown voltage is not exceeded between the thermal contact point and electrically conductive structures. However, within the predetermined range, the potential of the thermal contact point is not predetermined, so that the contact point in the heat path need not be subordinated to an electrically insulating material.

In accordance with at least one embodiment, the electrical protection element limits an electrical voltage between the thermal contact point and the first or second electrically conductive structure to a maximum value. For example, the maximum value of the electrical voltage between the thermal contact point and the first or second electrically conductive structure is lower than the breakdown voltage of the carrier. In particular, the maximum value is maximum including 1000 V, in particular maximum 500 V, preferably maximum 100 V. In particular, the electrical protection element is set up the electrical voltage between the thermal pad and the first or second electrically conductive structure, regardless of the polarity of the voltage to limit a maximum value. Advantageously, therefore, during intended operation, and in particular in the case of an ESD pulse, the breakdown voltage of the carrier between the thermal contact point and the first or second electrically conductive structure is not exceeded.

In accordance with at least one embodiment, the first and second inorganic insulating layers are formed with an oxide of the material of the metal core. For example, the first and second inorganic insulating layers are formed with the same material. In particular, the first and second inorganic insulating layers are made by oxidation of the metal core on the surface of the metal core. For example, the metal core is formed with aluminum. In particular, the metal core is nominally made of aluminum. The first and second inorganic insulating layers are formed with, for example, aluminum oxide. In particular, the first and second inorganic insulating layers are nominally of aluminum oxide. The first and second inorganic insulating layers may, for example, be so-called nanoceramics. Advantageously, the carrier has on its surface facing the component a similar coefficient of thermal expansion as the device, whereby the electronic component has a particularly high reliability. A 'similar' coefficient of thermal expansion may mean that the coefficients of expansion do not differ by more than 25%, in particular by not more than 15% or by not more than 5%.

In accordance with at least one embodiment, the thermal contact point and the electrical protection element are connected to one another in an electrically conductive manner by means of a third via, wherein the third via is electrically insulated from the metal core. The third via completely penetrates the carrier across or perpendicular to its main extension direction. In particular, a third inorganic insulating layer is arranged in the region of the third via, by means of which the third via is electrically insulated from the metal core. In particular, the first or the second electrically conductive structure can be electrically conductively connected to the first or second contact point by means of the metal core. The third via is formed, for example, with a same material as the thermal contact point and/or the third electrically conductive structure.

In accordance with at least one embodiment, the thermal contact point and the electrical protection element are electrically conductively connected to one another by means of the metal core. For example, the first inorganic insulating layer is removed in a first region and the second inorganic insulating layer is removed in a second region. In particular, the thermal contact point in the second region is in direct contact with the metal core. Further, the third electrically conductive structure in the first region may be in direct contact with the metal core.

In particular, the electronic component may have a plurality of thermal contact points which are arranged on the bottom surface of the carrier. By way of example, the multiplicity of thermal contact points is designed to be multi-connected or non-contiguous. For example, the carrier may have a plurality of second regions, wherein the second regions are not formed contiguous. In particular, the thermal contact points in different second regions can be in direct contact with the metal core. In particular, several of the plurality of thermal contact points may be electrically connected to the metal core of the carrier. Advantageously, this allows a particularly good electrically conductive connection between the thermal contact point and the protective element, wherein in particular the arrangement of a plurality of thermal contact points on the bottom surface of the carrier does not require additional vias.

According to at least one embodiment, the thermal contact point and the electrical protection element are arranged in a vertical direction non-overlapping with each other. For example, the vertical direction is perpendicular to the main direction of extension of the carrier. In particular, the protective element and the thermal contact point are electrically conductively connected to one another by means of the metal core. Advantageously, the electrically conductive connection between the protective element and the thermal contact point by means of the metal core allows the thermal contact point and the protective element offset from each other, so that along the top surface, the position of the protective element is selectable regardless of the position of the thermal contact point along the bottom surface of the carrier.

In accordance with at least one embodiment, the electrical protection element and the component are parts of a common semiconductor component. In particular, the electrical protection element is in direct mechanical contact with the device. For example, the electrical protection element and the component are produced in a common manufacturing process. For example, the electrical protection element comprises at least one semiconductor diode. Advantageously, the integration of the component and the protective element in a common semiconductor component enables a particularly space-saving design of the electronic component.

In accordance with at least one embodiment, the electrical protection element is formed with two Zener diodes connected in antiseries. For example, the two Zener diodes are arranged on different electrically conductive structures on the top surface of the carrier. In particular, the Zener diodes are connected by means of bonding wires such that the two Zener diodes are connected in series with opposite polarity. The maximum value of the electrical voltage, which is predetermined by means of the electrical protection element, results from the sum of the forward voltage of a Zener diode and the Zener voltage of the further Zener diode. For example, the Zener diodes may have a Zener voltage of 50V, 100V, 200V, 300V or 1000V. In antiserial series connection, current can only flow through the Zener diodes when both diodes are open. This applies in both directions. Advantageously, a leakage current which could flow through the thermal contact point can thus be reduced.

In accordance with at least one embodiment, the electrical protection element is formed with two diodes connected in antiparallel. In this design, the maximum value of the electrical voltage corresponds in each case to the lower forward or reverse voltage from which one of the two diodes enables a current flow. Advantageously, the carrier can thus be protected against particularly low electrical voltages.

In accordance with at least one embodiment, the electrical protection element is formed with a varistor. By way of example, the varistor is an electrical resistance which varies as a function of the applied electrical voltage. In particular, the varistor has a higher electrical resistance for a voltage less than the predetermined maximum value, than at voltages which are greater than the maximum value.

Furthermore, a method for producing an electronic component is specified. With the method, in particular, an electronic component described here can be produced. That is, the features disclosed for the electronic component are also disclosed for the method and vice versa.

In accordance with at least one embodiment of the method for producing a carrier, a metal core is provided in a method step A). The metal core is, for example, a foil or a metal sheet which is formed with a metal. In particular, the metal core consists of the metal. For example, the metal core is formed with aluminum.

In accordance with at least one embodiment of the method, a first and a second inorganic insulating layer are produced in a method step B). In particular, the first and second inorganic insulating layers may be made by anodic oxidation of the metal core. For example, the metal core is electrically conductively contacted and energized for anodic oxidation, so that on the outer surfaces of inorganic insulating layers are formed. In particular, the inorganic insulating layers are formed with an oxide of the material of the metal core. In particular, the inorganic insulating layers are formed on all exposed surfaces of the metal core.

In accordance with at least one embodiment of the method, in a method step C) the first inorganic insulating layer is removed in a first region and the second inorganic insulating layer is removed in a second region. In particular, the top surface of the carrier is formed with the first inorganic insulating layer of the carrier. The bottom surface of the carrier may be formed with the second inorganic insulating layer. In particular, the first region occupies at most 70%, preferably at most 30%, of the top surface of the carrier. In particular, the second region occupies a maximum of 70%, in particular a maximum of 30%, of the bottom surface of the support. Furthermore, in method step C), the first inorganic insulating layer can be removed in a plurality of first regions and/or the second inorganic insulating layer can be removed in a plurality of second regions. The inorganic insulating layers can be removed, for example, by means of mechanical processing, in particular grinding and/or drilling, by wet-chemical etching, by dry etching, by laser ablation and/or by photolithography.

In accordance with at least one embodiment of the method, a thermal contact point in the second region is applied in a method step D). For example, the thermal contact point is applied by means of a galvanic process or by vapor deposition in the second region. In particular, the thermal contact point is in direct contact with the metal core. For example, the thermal contact point and the metal core in the second region are electrically conductively connected to one another.

In accordance with at least one embodiment of the method, in a method step E), a third electrically conductive structure is applied in the first region. For example, the third electrically conductive structure is applied by means of a galvanic process or by vapor deposition in the second region. In particular, the third electrically conductive structure is in direct contact with the metal core. For example, the third electrically conductive structure and the metal core in the second region are electrically conductively connected to one another.

In accordance with at least one embodiment of the method, an electrical protective element is applied to the third electrically conductive structure in a method step F), the thermal contact point and the electrical protective element being electrically conductively connected to one another via the metal core. For example, the protective element is connected by means of soldering or by means of wire bonding electrically conductively connected to the third electrically conductive structure.

The process steps A) to F), in particular the process steps A) to C), can be carried out in the order mentioned.

In accordance with at least one embodiment of the method, in a method step A1), which is carried out before method step B), at least one first and one second aperture are produced. For example, the first and the second breakthrough are generated by laser ablation, drilling or by etching.

In accordance with at least one embodiment, a third inorganic insulating layer is arranged in method step B) in the region of the first and the second aperture. In particular, the third inorganic insulating layer is formed by anodic oxidation of the material of the metal core.

According to at least one embodiment, the first via in the first breakthrough and the second via in the second breakthrough are formed by means of an electrically conductive material. For example, the first contact point and the first electrically conductive structure are electrically conductively connected to one another by means of the first via. Furthermore, the second contact point and the second electrically conductive structure can be connected to one another in an electrically conductive manner by means of the second via.

According to at least one embodiment of the method for producing an electronic component, in method step B), a first and a second metallic layer are deposited on the metal core, wherein the first and the second metallic layer are formed with different materials, and the first metallic layer is converted into the first inorganic insulating layer and the second metallic layer is converted into the second inorganic insulating layer. For example, the first and second metallic layers are deposited galvanically or by vapor deposition on opposing major surfaces of the metal core. The metal core may in this case be formed, for example, with a metallic material which, for example, comprises copper or consists of copper.

The first and second metallic layers may be formed with another metallic material. In particular, the first and the second metallic layer may be formed with aluminum or consist of aluminum. In particular, the first and the second metallic layer can be converted into the first and the second inorganic insulating layer by means of oxidation, in particular by means of anodic oxidation.

Further advantages and advantageous embodiments and further developments of the electronic component and of the method for producing an electronic component result from the following exemplary embodiments illustrated in conjunction with the figures.

FIGS. 1, 4, 6, 8 and 17 show top views of the top surface of exemplary embodiments of electronic components.

FIGS. 2 and 16 each show a plan view of a schematic illustration of the bottom surface of an exemplary embodiment of an electronic component.

Figure 1:
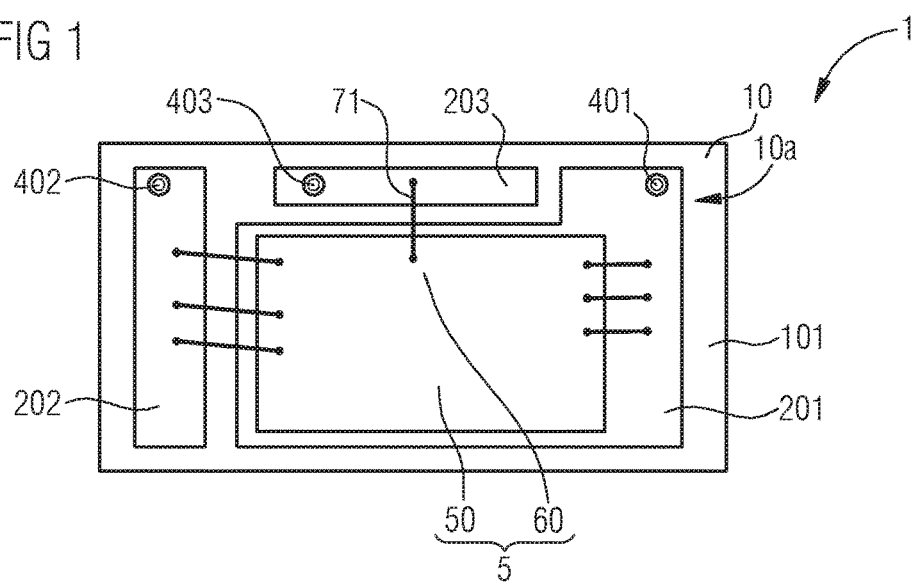

The same, similar or equivalent elements are provided in the figures with the same reference numerals. The figures and the proportions of the elements shown in the figures with each other are not to be considered to scale. Rather, individual elements may be exaggerated in size for better representability and/or better intelligibility.

FIG. 1 shows a schematic plan view of the top surface 10a of an exemplary embodiment of an electronic component 1. The electronic component 1 comprises a carrier 10 having a first and a second inorganic insulating layer 101, 102, between which a metal core is arranged. In particular, the top surface 10a of the carrier 10 is formed with the first inorganic insulating layer 101. Furthermore, the electronic component 1 comprises a first, a second and a third electrically conductive structure 201, 202, 203, which are arranged on the top surface 10a of the carrier 10. The electrically conductive structures 201, 202, 203 are formed with an electrically conductive material, in particular a metal. The first, the second and the third electrically conductive structure 201, 202, 203 are not formed contiguous. On the carrier 10, a component 50 and an electrical protection element 60 are arranged on the side of the top surface 10a.

In particular, the electrical protection element 60 and the device 50 are parts of a common semiconductor device 5. For example, the electrical protection element 60 and the device 50 are manufactured in a common manufacturing process. The semiconductor device 5 is disposed on the first electrically conductive structure 201. In particular, the component 5 is electrically conductively connected to the first electrically conductive structure 201. Furthermore, the component 5, in particular the electrical protection element 50, is electrically conductively connected to the third electrically conductive structure 203 by means of a bonding wire 71. Furthermore, the component 50 is electrically conductively connected to the second electrically conductive structure 202 by means of a bonding wire 71. In particular, the first electrically conductive structure 201 is arranged on a first via 401, the second electrically-conductive structure 202 is arranged on a second via 402, and the third electrically conductive structure 203 is arranged on a third via 03. The first, second and third vias 401, 402 and 403 completely penetrate the carrier 10 transversely to its main extension plane.

The first electrically conductive structure 201 is electrically conductively connected to a first electrical contact point 301, which is arranged on the bottom surface 10b facing away from the top surface 10a. The second electrically conductive structure 202 is electrically conductively connected to a second electrical contact point 302, which is arranged on the bottom surface 10b. The third electrically conductive structure 203 is electrically conductively connected to a thermal contact point 303, which is arranged on the bottom surface 10b facing away from the top surface 10a. The device 50 is electrically conductively connected to the first and the second electrically conductive structure 201, 202. The electrical protection element 60 is electrically conductively connected to the third electrically conductive structure 203 and the first 201 or the second 202 electrically conductive structure. In the present case, the electrical protection element 60 is electrically conductively connected to the third 203 and the first 201 electrically conductive structure.

Figure 2:
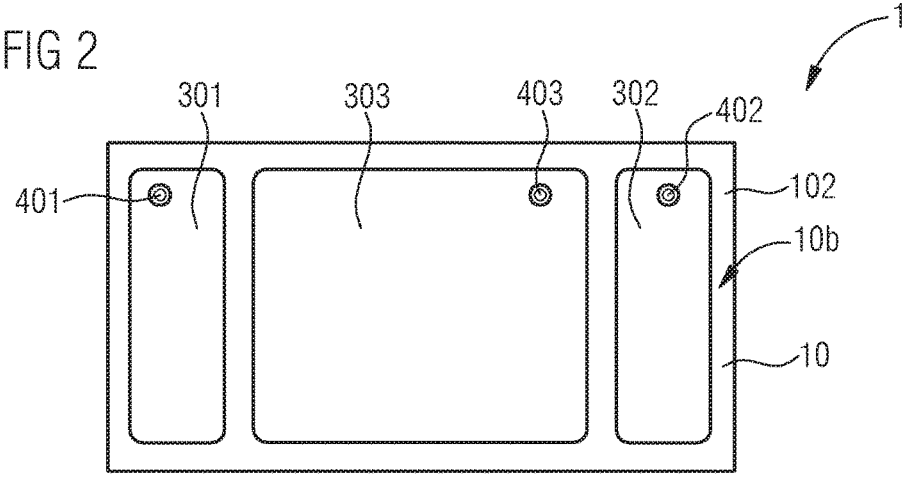

The FIG. 2 shows a schematic plan view of the bottom surface 10b of an embodiment of an electronic component 1. On the bottom surface 10b of the carrier 10, the first contact point 301, the second contact point 302 and the thermal contact point 303 are arranged. The contact points 301, 302, 303 are arranged at a distance from each other on the bottom surface 10b. For example, the bottom surface 10b of the carrier 10 is formed with the second inorganic insulating layer 102. The electrical protective element 60 arranged on the top surface 10a is connected in an electrically conductive manner to the third electrically conductive structure 203 and via the third via 403 to the thermal contact point 303. The first contact point 301 is electrically conductively connected to the first electrically conductive structure 201 and the component 50 via the first via 401. The second contact point 302 is electrically conductively connected to the second electrically conductive structure 202 and the component 50 via the second via 402. In particular, during intended operation, the component 50 can be electrically conductively contacted and operated via the first contact point 301 and the second contact point 302. The thermal contact point 303 is designed to dissipate the heat generated in the intended operation of the electronic component 1. In particular, the thermal pad 303 has a larger exposed surface than the first and second contact points 301, 302.

Figure 16:
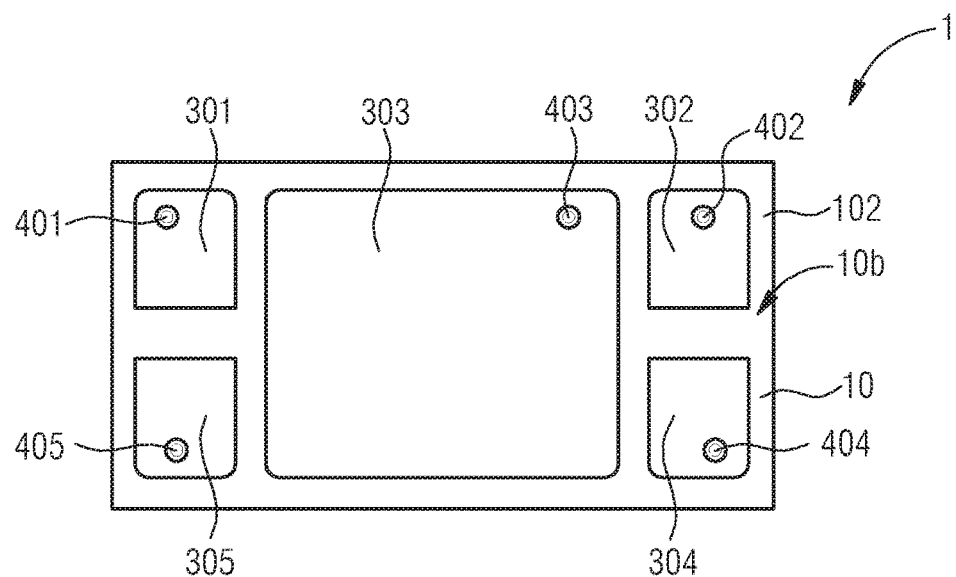

The FIG. 16 shows a schematic plan view of the bottom surface 10b of an embodiment of an electronic component 1. On the bottom surface 10b of the carrier 10, the first electrical contact point 301, the second electrical contact point 302, a third electrical contact point 304, a fourth electrical contact point 305 and the thermal contact point 303 is arranged. The electronic component 1 has more than two, in particular exactly four, electrical contact points 301, 302, 304, 305. For example, during intended operation of the electronic component 1, at least two of the electrical contact points 301, 302 are at a different electrical potential. The third 304 and/or fourth 305 electrical contact point may, for example, be set up so that a signal can be transmitted via the latter during intended operation. By way of example, data can be transmitted by means of the signal and/or the component 50 can be controlled by means of the signal.

Figure 17:
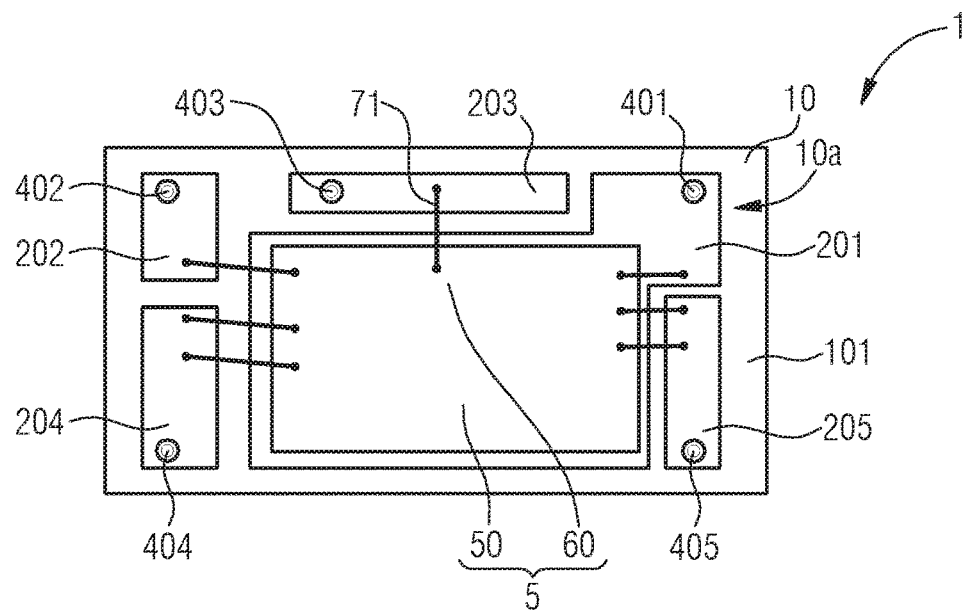

The FIG. 17 shows a schematic plan view of the top surface 10a of an exemplary embodiment of an electronic component 1. In particular, FIG. 17 shows the top surface 10a of the electronic component, the bottom surface 10b of which is illustrated in FIG. 16. The electronic component 1 comprises a carrier 10 with a first and a second inorganic insulating layer 101, 102, between which a metal core 105 is arranged. On the carrier 10, a component 50 and an electrical protection element 60 are arranged on the side of the top surface 10a. Furthermore, the electronic component 1 comprises a first, a second, a third, a fourth and a fifth electrically conductive structure 201, 202, 203, 204, 205, which are arranged on the top surface 10a of the carrier 10. The electrically conductive structures 201, 202, 203, 204, 205 are formed with an electrically conductive material, in particular a metal. The electrically conductive structures 201, 202, 203, 204, 205 are not formed contiguous.

The first electrically conductive structure 201 is electrically conductively connected to the first electrical contact point 301 by means of a first via 401. The second electrically conductive structure 202 is electrically conductively connected to the second electrical contact point 302 by means of a second via 402. The third electrically conductive structure 203 is electrically conductively connected to the thermal contact point 303 by means of a third via 403. The fourth electrically conductive structure 204 is electrically conductively connected to the third electrical contact point 304 by means of a fourth via 404. The fourth electrically conductive structure 205 is electrically conductively connected to the fourth electrical contact point 305 by means of a fifth via 404.

Figure 3:
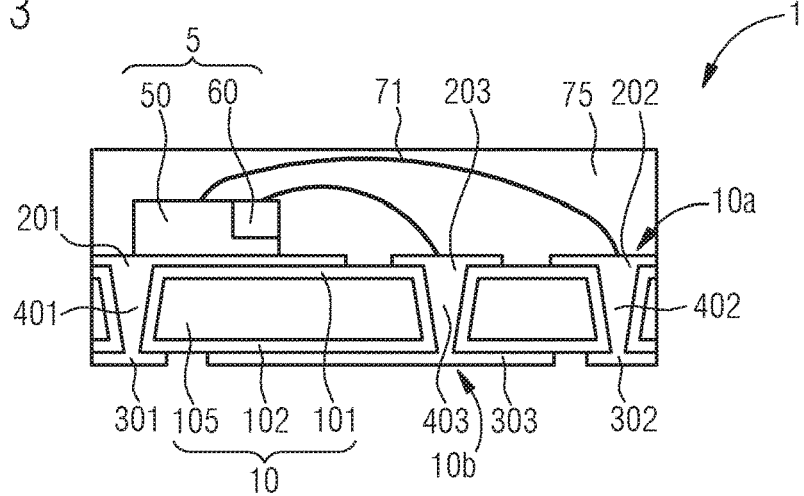
FIGS. 3, 5, 7, 9 and 10 are schematic sectional views of exemplary embodiments of electronic components.

The FIG. 3 shows a schematic sectional view of an electronic component 1 according to an embodiment. The electronic component 1 has a carrier 10 which is formed with a metal core 105, a first inorganic insulating layer 101 and a second inorganic insulating layer 102. In particular, the metal core 105 is potential-free. The semiconductor component 5 arranged on the top surface 10a is electrically conductively connected to the first, the second and the third electrically conductive structure 201, 202, 203. In particular, the electrical protection element 60 is electrically conductively connected to the third electrically conductive structure 203 by means of a bonding wire 71. The component 50 is electrically conductively connected to the second electrically conductive structure 202 by means of a bonding wire 71. On the top surface 10a, a potting 75 is arranged, which surrounds the semiconductor device 5.

Figure 4:
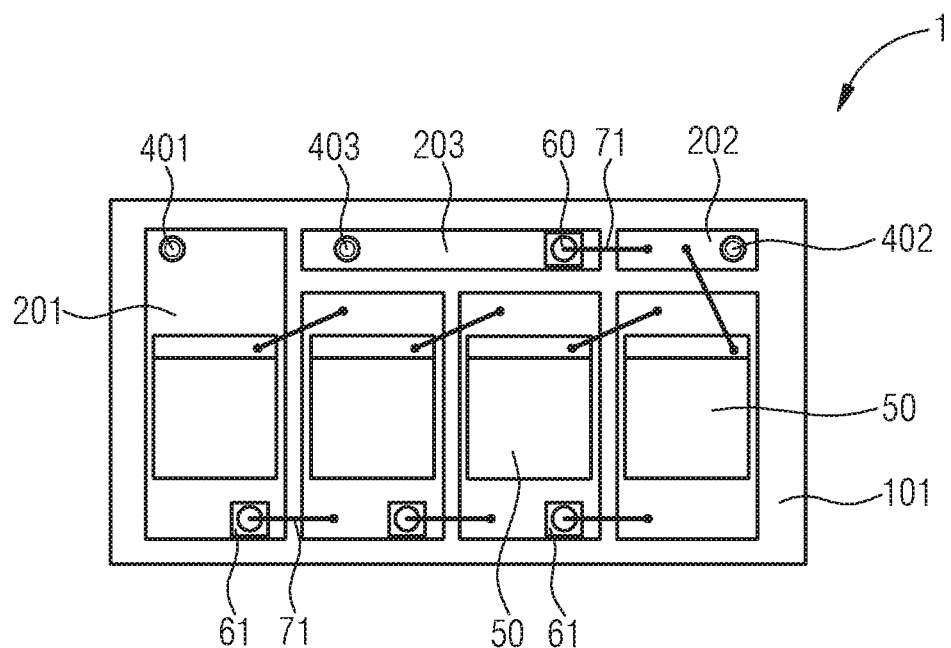

The FIG. 4 shows a schematic plan view of the top surface 10a of an exemplary embodiment of an electronic component 1, which comprises four components 50. The components 50 are arranged on separate electrically conductive structures 200 and are electrically conductively interconnected by means of bonding wires 71. In particular, each component 50 is connected in parallel by means of a further protective element 61. The further protective element 61 protects the component 50 connected in parallel to the further protective element 61 from excessive voltages.

The protective element 60 is arranged on the third electrically conductive structure 203 and electrically conductively connected to the second electrically conductive structure 202 by means of a bonding wire 71. During intended operation, the electrical protection element 60 limits an electrical voltage U between the thermal contact point 303 and the first or second electrically conductive structure 201, 202 to a maximum value. In particular, the maximum value of the electrical voltage U between the thermal contact point 303 and the second electrically conductive structure 202 is smaller than a breakdown voltage of the carrier 10. For example, the carrier 10 has a breakdown voltage of 100 V, in particular 500 V, particularly preferably 1000 V.

Figure 5:
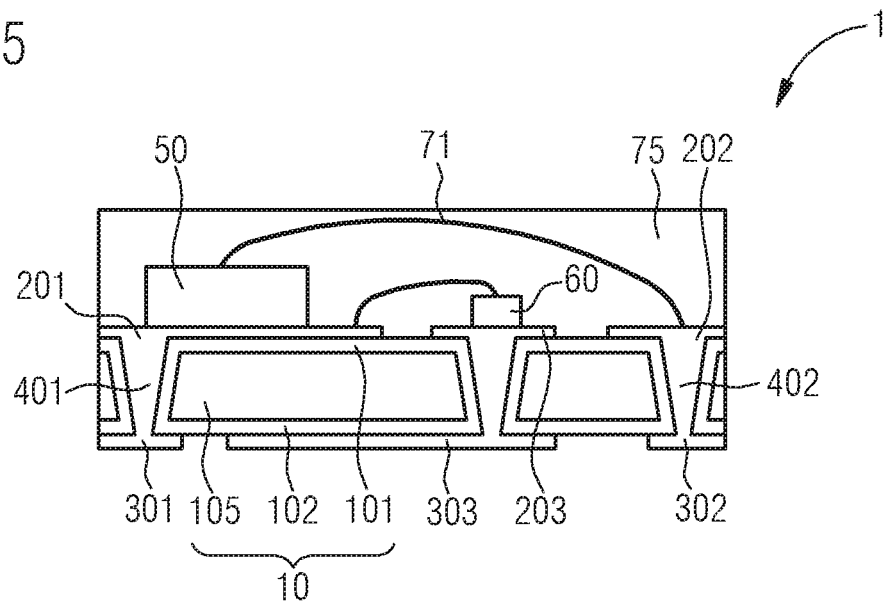

The FIG. 5 shows a schematic sectional view of an electronic component 1 according to one exemplary embodiment. In contrast to the exemplary embodiment illustrated in FIG. 3, the protective element 60 is not arranged on the same electrically conductive structure 201 as the component 50. In the present case, the protective element 60 is arranged on the third electrically conductive structure 203 and the component 50 is arranged on the first electrically conductive structure 201. By means of a bonding wire 71, the protective element 60 is electrically conductively connected to the first electrically conductive structure 201. Thus, the electronic component 1 is protected against an electrical flashover from the first electrically conductive structure 201 to the thermal contact point 303. From which voltage value between the first electrically conductive structure 201 and the thermal contact point 303, the protective element 60 allows a current flow, can be selected depending on the breakdown voltage of the carrier 10. In particular, the breakdown voltage of the carrier 10 depends on the material properties of the inorganic electrically insulating layers and the metal core 105.

By way of example, the first and second inorganic insulating layers 101, 102 have a thickness of not more than 20 µm, in particular not more than 50 µm. For example, the inorganic insulating layers are formed with a material having a breakdown voltage of 20 volts per micron. For example, the metal core 105 is formed with aluminum. In particular, the first and second inorganic electrically insulating layers 101, 102 are formed with aluminum oxide. In particular, the first and second inorganic insulating layers 101, 102 are formed with an oxide of the material of the metal core 105. The protective element 60 prevents a current from being able to be impressed into the electronic component 1 via the thermal contact point 303 in order, for example, to operate the component 50.

In particular, the protective element 60 may be formed with a varistor. Above a predetermined maximum value, the differential resistance of the varistor decreases abruptly. The characteristic of the varistor is symmetrical to the voltage, the polarity does not matter. The varistor can be formed, for example, with a metal oxide, in particular with the material of the first or second inorganic insulating layer 101, 102.

Figure 6:
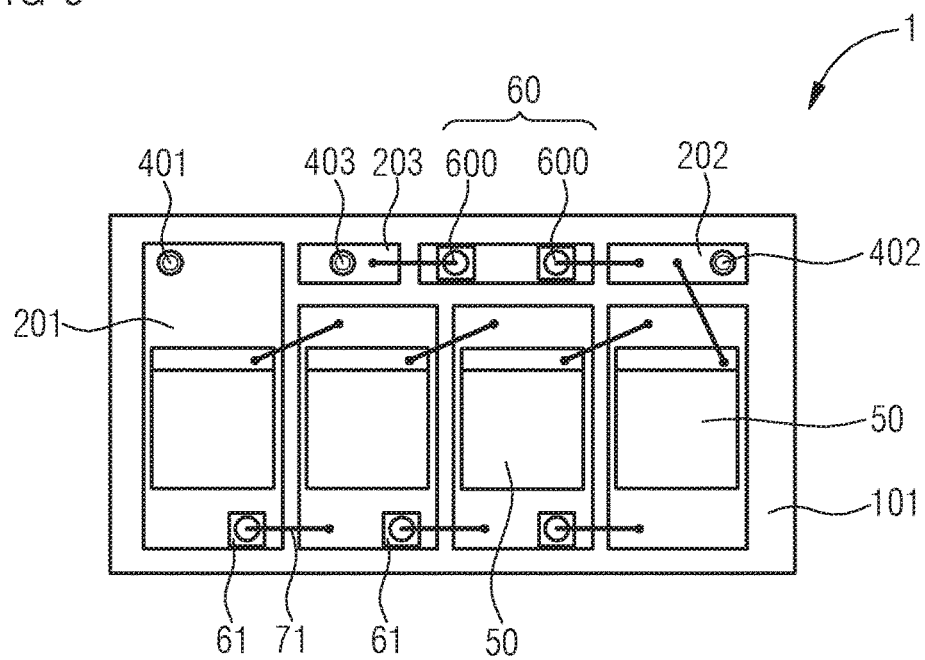

FIG. 6 shows a schematic plan view of the top surface 10a of an electronic component 1 according to one exemplary embodiment. In contrast to the exemplary embodiment illustrated in FIG. 4, according to FIG. 6 the protective element 60 is formed with two Zener diodes 600 connected in antiseries. In particular, the Zener diodes 600 are arranged on a common electrically conductive structure of the electronic component 1. Thus, at least one of the diodes of the protection element 60, when exceeding the maximum value of the electrical voltage U between the second electrically conductive structure 202 and the thermal contact point 303, is operated in the reverse direction. Consequently, the maximum value at which a nominal current flow through the protective element 60 is possible is predetermined by the sum of the Zener voltage and the forward voltage of the two Zener diodes 600. In particular, the sum of the Zener voltage and the forward voltage of the two Zener diodes 600 of the protection element 60 is selected such that this sum is less than the breakdown voltage of the carrier 10.

Figure 7:
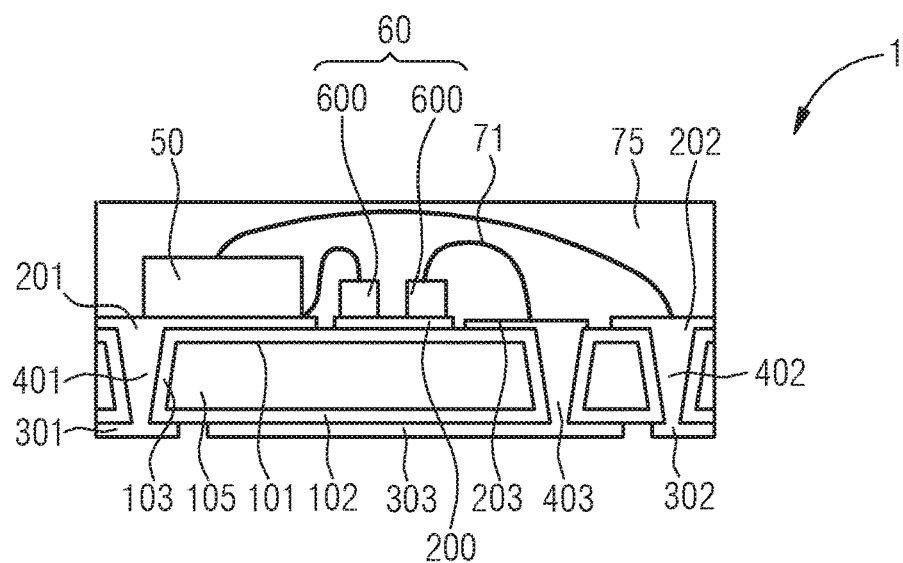

The FIG. 7 shows a schematic sectional view of an embodiment of an electronic component 1. In contrast to the embodiments shown in FIG. 5 and FIG. 3, the protective element 60 is formed with two Zener diodes 600. In particular, the two Zener diodes 600 are connected in antiseries to one another. For example, the two Zener diodes 600 are arranged on a common electrically conductive structure 200. Furthermore, a Zener diode is electrically conductively connected to the third electrically conductive structure 203 by means of a bonding wire 71. The other Zener diode 600 is electrically conductively connected to the first electrically conductive structure 201 by means of a bonding wire 71. In particular, the component 50 is also connected in an electrically conductive manner to the first electrically conductive structure 201. For example, the component 50 can be operated by energizing the first and second contact points 301, 302.

Figure 8:
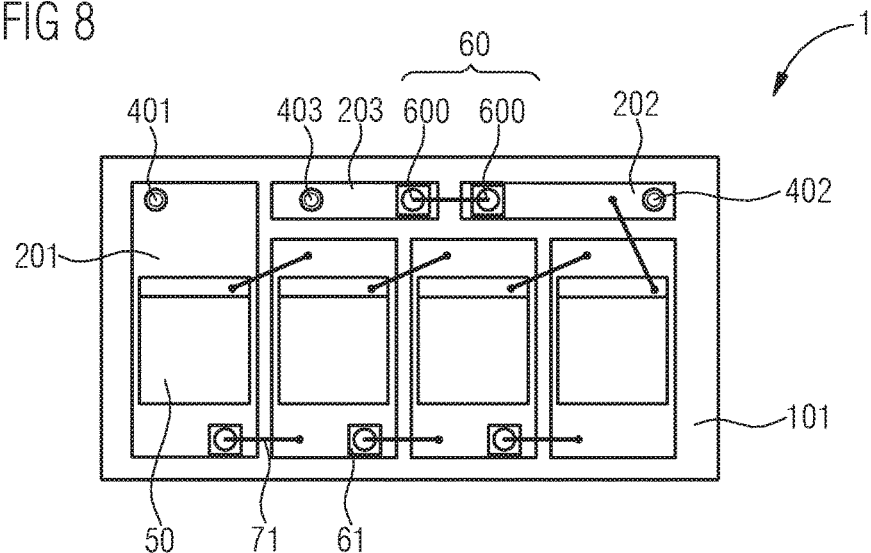

FIG. 8 shows a schematic plan view of the top surface 10a of an electronic component 1 according to an exemplary embodiment. Analogous to the exemplary embodiment illustrated in FIG. 6, the protective element 60 is formed with two antiseries Zener diodes 600 connected in antiseries. In contrast to the exemplary embodiment illustrated in FIG. 6, the two Zener diodes 600 are arranged on different electrically conductive structures 202, 203. By means of a bonding wire 71, the two Zener diodes 600 of the protective element 60 are electrically conductively connected to one another.

Figure 9:
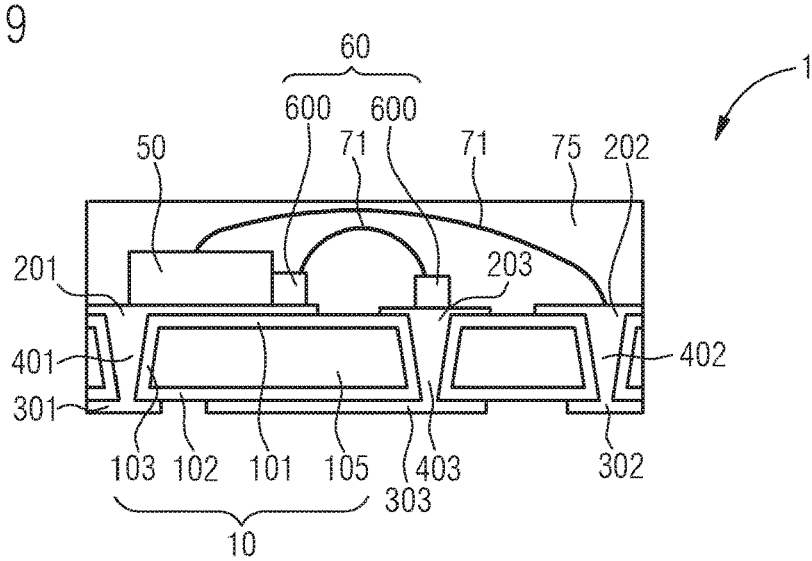

FIG. 9 shows a schematic sectional view of an exemplary embodiment of an electronic component 1. In contrast to FIG. 7, FIG. 9 shows an exemplary embodiment in which the Zener diodes with which the protective element 60 is formed are arranged on different electrically conductive structures 201, 203. In particular, a Zener diode 600 is arranged on the third electrically conductive structure 203, and a further Zener diode 600 is arranged on the first electrically conductive structure 201. The Zener diodes 600 are electrically conductively connected to one another by means of a bonding wire 71.

Figure 10:
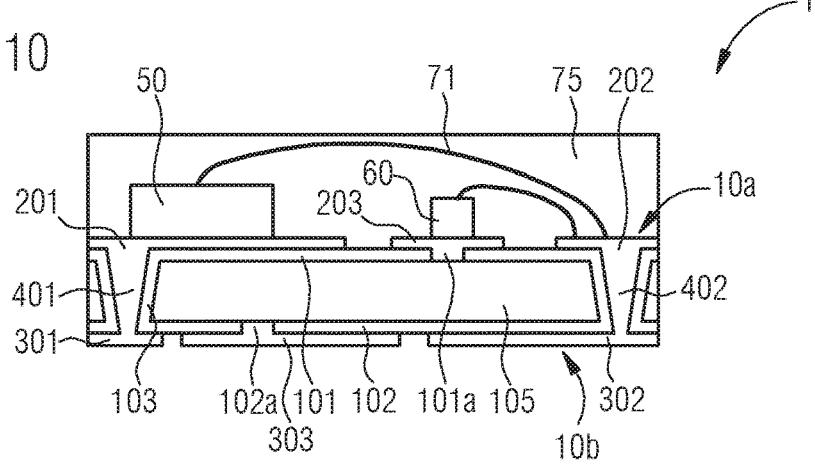

FIG. 10 shows a schematic sectional view of an electronic component 1, according to an exemplary embodiment. In contrast to the exemplary embodiments illustrated in FIG. 3, FIG. 5, FIG. 7 and FIG. 9, the third electrically conductive structure 203 and the thermal contact point 303 are not electrically conductively connected to one another by means of a third via 403. In the present case, the first inorganic insulating layer 101 and the second inorganic insulating layer 102 have a first region 101 a and a second region 102 a, in which the first and second inorganic insulating layers 101, 102 are removed. In the first region 101a, the third electrically conductive structure 203 is connected in an electrically conductive manner to the metal core 105. In particular, the third electrically conductive structure 203 and the metal core 105 are in direct contact with each other in the first region 101a.

In the second region 102a, the thermal contact point 303 is electrically conductively connected to the metal core 105. In particular, the thermal contact point 303 and the metal core 105 are in direct contact with each other in the second region 102a. The thermal contact point 303 and the third electrically conductive structure 203 are electrically conductively connected to one another by means of the metal core 105. In particular, the electronic component 1 can have a multiplicity of thermal contact points 303, which are electrically conductively connected to the metal core 105 via different second regions 102a. Advantageously, this allows an electrically conductive connection of a plurality of thermal contact points 303 with the protective element 60, wherein the thermal contact points 303 are not formed contiguous. This enables a particularly high density of thermal contact points 303 on the bottom surface 10b of the carrier 10, whereby heat arising in the intended operation of the component 50 can be dissipated particularly efficiently.

In particular, the thermal pad 3 and the electrical protection element 60 are arranged non-overlapping in a vertical direction. The vertical direction is perpendicular to the main plane of extension of the carrier 10.

Figure 11:
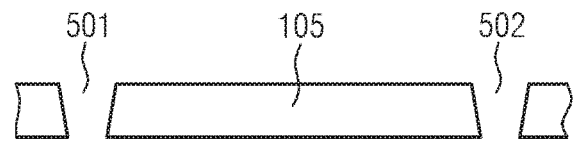
FIGS. 11 to 15 show schematic sectional representations of an exemplary embodiment of a production method for producing an electronic component.

FIG. 11 shows a metal core 105 according to method steps A) and A1). In step A), a metal core 105 was provided. In method step A1), a first breakthrough 501 and a second breakthrough 502 were produced in the metal core 105.

Figure 12:
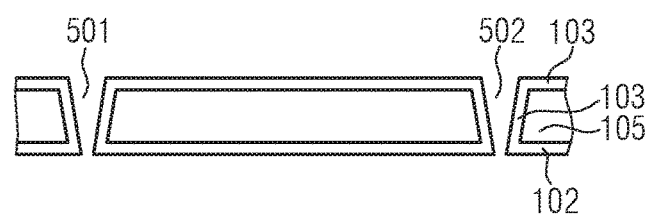
Figure 13:
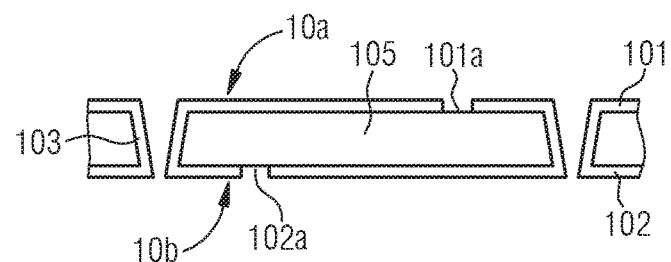

FIG. 12 shows a sectional view of the method for producing an electronic component according to an embodiment according to method steps B) and C). In method step B), a first and a second inorganic insulating layer 101, 102 were produced by means of anodic oxidation of the metal core 105. Furthermore, a third inorganic insulating layer 103 was produced in the region of the first 501 and the second aperture 502 by means of anodic oxidation. The metal core 105 is completely covered on all sides by inorganic insulating layers after process step B).

In the method step C), the first inorganic insulating layer 101 is removed in a first region 101a, so that the metal core 105 has an outwardly-releasing surface on the top surface 10a. Furthermore, in method step C), the second inorganic insulating layer 102 is removed in a second region 102a, such that the metal core 205 has an outwardly exposed surface on the bottom surface 10b. For example, the inorganic insulating layers in the first and second regions 101a, 102a are removed by mechanical processing, especially grinding or drilling, by wet chemical etching in conjunction with upstream photolithography, dry etching in conjunction with upstream lithography, or laser ablation.

Figure 14:
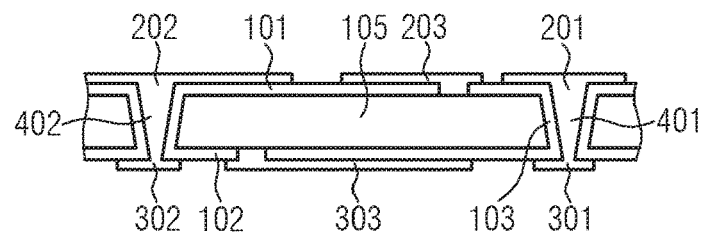

FIG. 14 shows a sectional view of the production method of an electronic component 1 according to an exemplary embodiment according to method steps D), E) and F). In a method step D), a thermal contact point 303 was arranged in the second region 102a. The thermal contact point 303 is electrically conductively connected to the metal core 105 in the second region 102a. In method step E), a third electrically conductive structure was arranged in the first region 101a. The third electrically conductive structure 203 is electrically conductively connected to the core 105. Further, the breakthroughs 501, 502 were filled with an electrically conductive material, so that in the first breakthrough 501 a first via 401 and in the second breakthrough 502 a second via 402 is formed. On the bottom surface 10b of the carrier, a second contact point 302 is arranged in the region of the second aperture 502, and a first contact point 301 is arranged in the region of the first aperture 501. Furthermore, a second electrically conductive structure 202 is arranged on the top surface 10a in the region of the second via, and a first electrically conductive structure 201 is arranged in the region of the first via. In particular, the electrically conductive structures 201, 202 and the contact points 301, 302, which are electrically conductively connected to one another by means of vias 401, 402, are not electrically conductively connected to the metal core 105.

Figure 15:
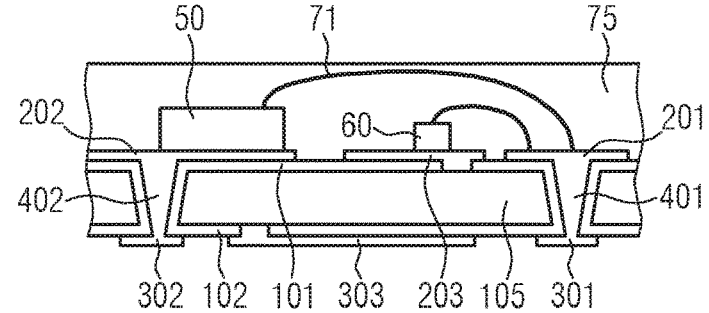

FIG. 15 shows a schematic sectional view of a method for producing an electronic component after method step F). In method step F), an electrical protective element 60 is electrically conductively connected to the third electrically conductive structure 203, the thermal contact point 303 and the electrical protective element 60 being electrically conductively connected to one another via the metal core 105. The component 50 is arranged on the top surface 10a of the carrier 10 and contacted by means of a bonding wire 71 in an electrically conductive manner. In particular, the device 50 is operable by impressing a current on the first and second contact points 301, 302.

The invention is not limited by the description based on the embodiments of these. Rather, the invention encompasses any novel feature as well as any combination of features, which includes in particular any combination of features in the patent claims, even if this feature or combination itself is not explicitly stated in the patent claims or exemplary embodiments.

LIST OF REFERENCE NUMBERS 1 electronic component
5 conductor device 10 support
10a top surface
10b bottom surface
50 component
60 protection element
71 bonding wire
75 potting
101 first inorganic insulating layer
101a first region
102 second inorganic insulating layer
102a second region
103 third inorganic insulating layer
105 metal core
200 electrically conductive structure
201 first electrically conductive structure
202 second electrically conductive structure
203 third electrically conductive structure
204 fourth electrically conductive structure
205 fifth electrically conductive structure
301 first electrical contact point
302 second electrical contact point
303 thermal contact point
304 third electrical contact point
305 fourth electrical contact point
401 first via
402 second via
403 third via
404 fourth via
405 fifth via
501 first breakthrough
502 second breakthrough
503 third breakthrough
600 Zener diode
U electrical voltage

The invention claimed is:

1. Electronic component with
a support comprising a first inorganic insulating layer and a second inorganic insulating layer, between which a metal core is arranged,
a first, a second and a third electrically conductive structure which are arranged on a top surface of the support,
a first and a second electrical contact point and a thermal contact point, which are arranged on a bottom surface of the support,
a component and an electrical protection element which are arranged on the side of the top surface of the support, in which
the first electrically conductive structure is electrically conductively connected to the first electrical contact point,
the second electrically conductive structure is electrically conductively connected to the second electrical contact point,
the third electrically conductive structure is electrically conductively connected to the thermal contact point,
the component is electrically conductively connected to the first and second electrically conductive structures,
the electrical protection element is electrically conductively connected to the third electrically conductive structure and the first or second electrically conductive structure.

2. Electronic component according to claim 1, wherein the component via the thermal contact point is not operable.

3. Electronic component according to claim 1, wherein the electrical protection element limits an electrical voltage (U) between the thermal contact point and the first or second electrically conductive structure to a maximum value.

4. Electronic component according to claim 1, in which the first and second inorganic insulating layers are formed with an oxide of the material of the metal core.

5. Electronic component according to claim 1, wherein the thermal contact point and the electrical protection element are electrically conductively connected by means of a third via, wherein the third via is electrically isolated from the metal core.

6. Electronic component according to claim 1, wherein the thermal contact point and the electrical protective element are electrically conductively connected to one another by means of the metal core.

7. Electronic component according to claim 1, in which the thermal contact point and the electrical protection element are non-overlapping with each other in a vertical direction.

8. Electronic component according to claim 1, in which the electrical protection element and the component are parts of a common semiconductor component.

9. Electronic component according to claim 1, in which the electrical protection element is formed with two Zener diodes connected in antiseries.

10. Electronic component according to claim 1, in which the electrical protection element is formed with two diodes connected in antiparallel.

11. Electronic component according to claim 1, in which the electrical protection element is formed with a varistor.

* * * * *